United States Patent
Back et al.

(10) Patent No.: US 9,130,504 B2
(45) Date of Patent: Sep. 8, 2015

(54) HF RESONATOR AND PARTICLE ACCELERATOR WITH HF RESONATOR

(75) Inventors: Michael Back, Erlangen (DE); Oliver Heid, Erlangen (DE); Michael Kleemann, Erlangen (DE)

(73) Assignee: Siemens Aktiengesellschaft, München (DE)

(*) Notice: Subject to any disclaimer, the term of this patent is extended or adjusted under 35 U.S.C. 154(b) by 0 days.

(21) Appl. No.: 14/344,265

(22) PCT Filed: Aug. 24, 2012

(86) PCT No.: PCT/EP2012/066495
§ 371 (c)(1),
(2), (4) Date: Oct. 9, 2014

(87) PCT Pub. No.: WO2013/037621
PCT Pub. Date: Mar. 21, 2013

(65) Prior Publication Data
US 2015/0042244 A1    Feb. 12, 2015

(30) Foreign Application Priority Data
Sep. 13, 2011   (DE) .......................... 10 2011 082 580

(51) Int. Cl.
*H01J 23/00* (2006.01)
*H01J 23/34* (2006.01)
(Continued)

(52) U.S. Cl.
CPC .. *H03B 1/02* (2013.01); *H01P 7/06* (2013.01); *H01P 7/10* (2013.01); *H05H 7/02* (2013.01); *H05H 7/18* (2013.01); *H05H 2007/025* (2013.01)

(58) Field of Classification Search
None
See application file for complete search history.

(56) References Cited

U.S. PATENT DOCUMENTS

| | | | |
|---|---|---|---|
| 5,497,050 A | 3/1996 | Cheo | |
| 6,724,261 B2 * | 4/2004 | Cheo | ............................ 330/295 |

(Continued)

FOREIGN PATENT DOCUMENTS

| | | |
|---|---|---|
| DE | 102009036418 A1 | 2/2011 |
| DE | 102009053624 A1 | 5/2011 |

(Continued)

OTHER PUBLICATIONS

Heid O., et al., "Compact Solid State Direct Drive RF Linac," Proceedings of IPAC, Kyoto, Japan, pp. 4278-4280, 2010.

(Continued)

*Primary Examiner* — Anh Tran
(74) *Attorney, Agent, or Firm* — Lempia Summerfield Katz LLC

(57) ABSTRACT

An HF resonator has a cylindrical cavity made of a dielectric material. The cavity includes a first cylindrical portion, a second cylindrical portion, and a dielectric ring that connects the first portion and the second portion. The inner face of the first cylindrical portion has an electrically conductive first inner coating. An inner face of the second cylindrical portion has an electrically conductive second inner coating. An electrically conductive first enclosed coating is arranged between the first cylindrical portion and the dielectric ring. An electrically conductive second enclosed coating is arranged between the second cylindrical portion and the dielectric ring. The first enclosed coating is conductively connected to the first inner coating. The second enclosed coating is conductively connected to the second inner coating. The HF resonator includes a device that is provided for applying a high-frequency electric voltage between the first enclosed coating and the second enclosed coating.

20 Claims, 1 Drawing Sheet

(51) Int. Cl.
*H01J 25/00* (2006.01)
*H05H 7/00* (2006.01)
*H03B 1/02* (2006.01)
*H05H 7/18* (2006.01)
*H01P 7/06* (2006.01)
*H01P 7/10* (2006.01)
*H05H 7/02* (2006.01)

(56) References Cited

U.S. PATENT DOCUMENTS

| | | | |
|---|---|---|---|
| 8,779,697 B2 * | 7/2014 | Baurichter et al. | ........... 315/505 |
| 2012/0133306 A1 | 5/2012 | Seliger et al. | |
| 2012/0229054 A1 | 9/2012 | Baurichter et al. | |

FOREIGN PATENT DOCUMENTS

| | | |
|---|---|---|
| EP | 0606870 A1 | 7/1994 |
| JP | H06342700 A | 12/1994 |
| JP | 2003303700 A | 10/2003 |
| JP | 2013511133 A | 3/2013 |
| WO | WO2011061026 A1 | 5/2011 |

OTHER PUBLICATIONS

Jing C., et al., "Progress Toward Externally Powered X-Band Dielectric-Loaded Accelerating Structures," IEEE Transactions on Plasma Science, vol. 38, No. 6, pp. 1354-1360, 2010.

Gai W., et al., "High-Power RF Tests on X-Band Dielectric-Loaded Accelerating Structures," IEEE Transactions on Plasma Science, vol. 33, No. 4, pp. 1155-1160, 2005.

French D. K., "Development of a dielectric loaded RF cavity for a muon accelerator," Nuclear Instruments and Methods in Physics Research, vol. 624, No. 3, pp. 731-734, 2010.

German Office Action dated May 22, 2012 for corresponding German Patent Application No. DE 10 2011 082 580.0 with English translation.

PCT Search Report and dated Jan. 4, 2013 for corresponding PCT/EP2012/066495 with English translation.

Japanese Office Action for German Application No. 2011P18190WOJP, mailed Apr. 14, 2015, with English Translation.

* cited by examiner

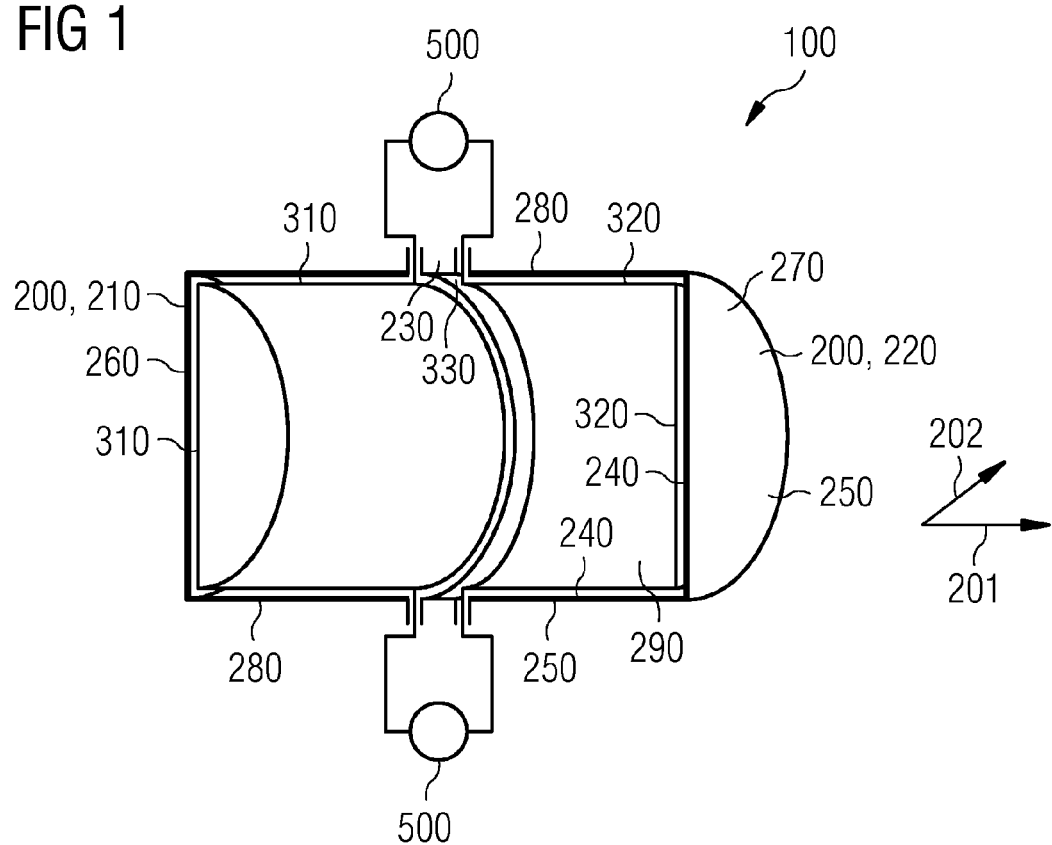
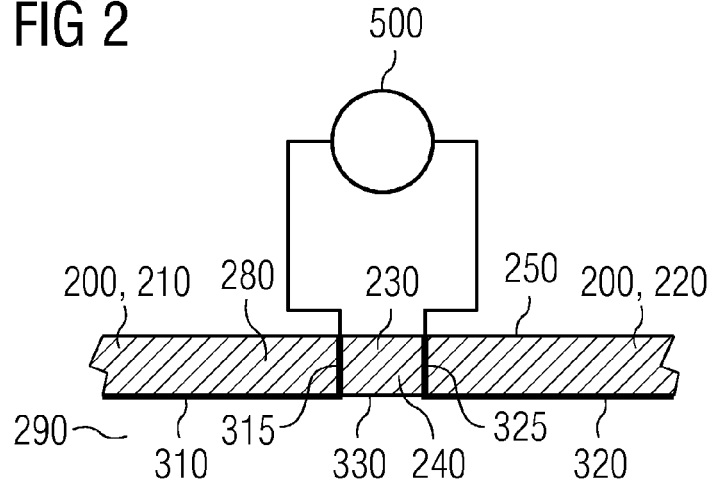

HF RESONATOR AND PARTICLE ACCELERATOR WITH HF RESONATOR

RELATED CASES

The present patent document is a §371 nationalization of PCT Application Serial Number PCT/EP2012/066495, filed Aug. 24, 2012, designating the United States, which is hereby incorporated by reference. This patent document also claims the benefit of DE 10 2011 082 580.0, filed Sep. 13, 2011, which is also hereby incorporated by reference.

FIELD

The present embodiments relate to an RF resonator and to a particle accelerator for accelerating electrically charged particles.

BACKGROUND

Radio-frequency electromagnetic oscillations may be excited in RF resonators. RF resonators may also be designated as cavity resonators. RF resonators are used, for example, in particle accelerators for accelerating electrically charged particles.

In order to excite a radio-frequency electromagnetic oscillation in an RF resonator, it is known to generate a radio-frequency power by a klystron or a tetrode, for example, to transport the power by a cable or a waveguide to the RF resonator and to couple the power into the RF resonator there via a radiation window or an RF antenna. However, very high RF powers cannot be obtained with this type of excitation.

EP 0 606 870 A1 discloses equipping an RF resonator with a conductive wall and with a plurality of solid-state transistors, which are provided for inducing a radio-frequency electric current flow in the wall of the RF resonator and thereby exciting a radio-frequency electromagnetic oscillation in the RF resonator. In this case, the excitation of the current flow takes place by the application of a radio-frequency electrical voltage via an electrically insulating circumferential slot in the wall of the RF resonator.

A use of RF resonators in particle accelerators for accelerating electrically charged particles requires evacuation of the RF resonator to a very low pressure. It has been found that electrically insulating slots filled with dielectric material in otherwise conductive walls of an RF resonator may be sealed only with difficulty and in a complex manner. In particular, different thermal expansions of the conductive and insulating materials may lead to leakages arising.

SUMMARY AND DETAILED DESCRIPTION

The scope of the present invention is defined solely by the appended claims and is not affected to any degree by the statements within this summary.

An RF resonator that may be evacuated better is provided. A particle accelerator including an RF resonator that may be evacuated better is provided.

An RF resonator according to one embodiment has a cylindrical cavity composed of a dielectric material. In this case, the cavity includes a first cylindrical portion, a second cylindrical portion and a dielectric ring connecting the first and second portions. An inner side of the first cylindrical portion has an electrically conductive inner coating. An inner side of the second cylindrical portion has an electrically conductive second inner coating. An electrically conductive first enclosed coating is arranged between the first cylindrical portion and the dielectric ring. An electrically conductive second enclosed coating is arranged between the second cylindrical portion and the dielectric ring. The first enclosed coating is conductively connected to the first inner coating. The second enclosed coating is conductively connected to the second inner coating. Moreover, the RF resonator includes a device for applying a radio-frequency electrical voltage between the first enclosed coating and the second enclosed coating. Advantageously, the cavity of this RF resonator simultaneously serves as vacuum vessel, insulator and carrier for the electrically conductive coating. As a result, the cavity of the RF resonator may advantageously be evacuated in a simple manner and does not require any perforations and seams that are difficult to seal. Since, in particular, large-area metal-ceramic connections can be dispensed with, problems as a result of different coefficients of thermal expansion do not arise.

In one embodiment of the RF resonator, the first enclosed coating and/or the second enclosed coating are/is embodied in ring-shaped fashion. Advantageously, RF power may then be coupled into the RF resonator over the entire outer circumference. Such coupling enables particularly high excitation powers.

In an alternative embodiment of the RF resonator, the first enclosed coating and/or the second enclosed coating are/is embodied as a plurality of conductive contact pins. Advantageously, in this embodiment, too, RF power may be coupled into the RF resonator at a plurality of locations of the outer circumference, enabling high excitation powers. A further advantage of this embodiment is that large-area metal-ceramic connections are not required, as a result of which the cavity may be sealed particularly reliably.

It is expedient for the dielectric ring to be oriented perpendicularly to a longitudinal direction of the cavity. Advantageously, this then results in a mirror symmetry and rotational symmetry of the RF resonator, by virtue of which an excitation of symmetrical oscillation modes is made possible.

It is likewise expedient for the dielectric ring to be arranged in the center of the cavity in a longitudinal direction of the cavity. Advantageously, this also results in a particularly symmetrical configuration of the cavity.

In one preferred embodiment of the RF resonator, the device includes a solid-state power transistor. Advantageously, with a solid-state power transistor, the RF power to be coupled into the RF resonator may be generated near the coupling-in location. Moreover, solid-state power transistors advantageously allow very high RF powers to be switched, enabling very high RF powers to be coupled into the RF resonator.

In one embodiment of the RF resonator, the device includes a plurality of solid-state power transistors arranged in the region of the dielectric ring in a manner extending circumferentially on the outside around the cavity. Advantageously, the provision of a plurality of solid-state power transistors enables the excitation of a particularly high RF power in the RF resonator.

In one embodiment of the RF resonator, the dielectric material is a glass or a ceramic. Advantageously, glass and ceramic have mechanical properties suitable for a use as vacuum vessel.

It is expedient for the cavity to have a circular-cylindrical shape. Advantageously, a cavity embodied in circular-cylindrical fashion enables an excitation of oscillation modes suitable for accelerating charged particles.

Preferably, the cavity is designed to be evacuated to a reduced air pressure compared with the surroundings of the cavity.

Advantageously, the RF resonator may then be used for accelerating electrically charged particles.

A particle accelerator for accelerating electrically charged particles includes an RF resonator of the type mentioned above. Advantageously, the RF resonator in this particle accelerator may be evacuated to a low pressure and in this case has no seams that are difficult to seal.

BRIEF DESCRIPTION OF THE DRAWINGS

The above-described properties, features and advantages and the way in which they are achieved will become clearer and more clearly understood in association with the following description of the exemplary embodiments which are explained in greater detail in association with the drawings, in which:

FIG. 1 shows a section through an RF resonator of one embodiment, and

FIG. 2 shows a section through a wall portion of the RF resonator of FIG. 1.

DETAILED DESCRIPTION

FIG. 1 shows an RF resonator 100 in a highly schematic illustration. A radio-frequency electromagnetic oscillation mode may be excited in the RF resonator 100. The RF resonator 100 may serve, for example, for accelerating electrically charged particles in a particle accelerator.

The RF resonator 100 includes a cavity 200 embodied as a hollow cylinder. In the illustration in FIG. 1, the cavity 200 is cut on the plane of the drawing. Consequently, FIG. 1 illustrates only a back half of the cavity 200.

The cavity 200 has a first portion 210 and a second portion 220. Each of the portions 210, 220 is likewise embodied in hollow-cylindrical fashion and open at a respective end side. The open sides of the portions 210, 220 are connected to one another via a ring 230 and thereby form the hollow-cylindrical cavity 200. The cavity 200 embodied in hollow-cylindrical fashion defines a longitudinal direction 201 and a radial direction 202, which is oriented perpendicularly to the longitudinal direction 201.

The first portion 210 of the cavity 200 includes a circular-disk-shaped first cover surface 260 of the cavity 200. The second portion 220 of the cavity 200 includes a likewise circular-disk-shaped second cover surface 270 of the cavity 200. In alternative embodiments, the first cover surface 260 and the second cover surface 270 may also be embodied differently than in circular-disk-shaped fashion. By way of example, the first cover surface 260 and the second cover surface 270 could be embodied in rectangular or elliptical fashion.

The first cover surface 260 and the second cover surface 270 are in each case oriented perpendicularly to the longitudinal direction 201 of the cavity 200. The first cover surface 260 and the second cover surface 270 are connected to one another via a lateral surface 280 of the cavity 200. The lateral surface 280 is formed by parts of the first portion 10, by the ring 230 and by parts of the second portion 220 of the cavity 200. The lateral surface 280 is oriented parallel to the longitudinal direction 201 of the cavity 200. The ring 230 is preferably oriented perpendicularly to the longitudinal direction 201. Preferably, the ring 230 is arranged centrally between the first cover surface 260 and the second cover surface 270. The ring 230 is preferably narrow in the longitudinal direction 201 relative to the total length of the cavity 200.

The cavity 200 encloses an interior 290. The cavity 200 has an inner side 240 facing the interior 290 and an outer side 250 facing the surroundings of the cavity.

The first portion 210 of the cavity 200, the second portion 220 of the cavity 200, and the ring 230 of the cavity 200 in each case are an electrically insulating dielectric material. Preferably, the first portion 210, the second portion 220, and the ring 230 are a glass or a ceramic. Advantageously, glass and ceramic materials are strong enough to withstand a high pressure difference between the interior 290 of the cavity 200 and the surroundings of the cavity 200.

An electrically conductive first inner coating 310 is arranged on the inner side 240 of the first portion 210 of the cavity 200. An electrically conductive second inner coating 220 is arranged on the inner side 240 of the second portion 220 of the cavity 200. The first inner coating 310 and the second inner coating 320 may be a metal, for example. No electrically conductive coating is provided on the inner side 240 of the ring 230. As a result, an inner gap 330 arises in the region of the ring 230 of the cavity 200, said inner gap electrically insulating the first inner coating 310 from the second inner coating 320.

FIG. 2 shows a section through the lateral surface 280 of the cavity 200 in the region of the ring 230 and of the inner gap 330.

An electrically conductive first enclosed coating 315 is provided between the first portion 210 of the cavity 200 and the ring 230. An electrically conductive second enclosed coating 325 is provided between the ring 230 and the second portion 220 of the cavity 200. The first enclosed coating 315 and the second enclosed coating 325 may be a metal, for example. Preferably, the first enclosed coating 315 and the second enclosed coating 325 are of the same material as the first inner coating 310 and the second inner coating 320. The first enclosed coating 315 is electrically conductively connected to the first inner coating 310. The second enclosed coating 325 is electrically conductively connected to the second inner coating 320. The first enclosed coating 215 runs between the inner side 240 and the outer side 250 of the cavity 200. The second enclosed coating 325 likewise runs between the inner side 240 and the outer side 250 of the cavity 200.

In one embodiment, the first enclosed coating 315 and the second enclosed coating 325 in each case include one or a plurality of contact pins extending between the inner side 240 and the outer side 250 of the cavity 200. If a plurality of contact pins are provided, then the contact pins are preferably distributed in the circumferential direction of the lateral surface 280 around the cavity 200. This embodiment has the advantage that only a few and small contact areas arise between the material of the enclosed coating 315, 325 and the material of the portions 210, 220 and of the ring 230 of the cavity 200. As a result, the regions between the first portion 210 of the cavity 200 and the ring 230 and between the ring 230 and the second portion 220 of the cavity 200 may be sealed in a simple manner. In particular, different coefficients of thermal expansion of the conductive material of the enclosed coating 315, 325 and of the insulating material of the portions 210, 220 and of the ring 230 do not lead to damage to the sealing of the cavity 200.

In an alternative embodiment, both the first enclosed coating 315 and the second enclosed coating 325 are embodied as rings extending circumferentially around the entire lateral surface 280 of the cavity 200. This embodiment advantageously allows RF power to be coupled into the cavity 200 along the entire outer circumference of the lateral surface 280 of the cavity 200. Since the first enclosed coating 315 between the first portion 210 of the cavity 200 and the ring 230 of the cavity 200 is embodied merely as a thin layer in the longitudinal direction 201, problems resulting from different coefficients of thermal expansion of the material of the first enclosed coating 315 and of the material of the first portion 210 and of the ring 230 of the cavity 200 do not arise in this embodiment either. This correspondingly also applies to the second enclosed coating 325.

The cavity 200 has no seams that are difficult to seal, and in particular no large-area metal-ceramic transitions. As a result, the cavity 200 may, with little outlay, be evacuated to a reduced pressure compared with an air pressure in the surroundings of the cavity 200. For the purpose of evacuating the cavity 200, the cavity 200 may have one or a plurality of suitable flanges. The first cover surface 260 and the second cover surface 270 of the cavity may additionally have suitable openings or windows through which a beam of charged particles may pass into the interior 290 of the cavity 200 and may exit from the interior 290 of the cavity 200.

On the outer side 250 of the cavity 200, the first enclosed coating 315 and the second enclosed coating 325 may be electrically contact-connected in order to apply an electrical voltage between the first enclosed coating 315 and the second enclosed coating 325. For this purpose, the RF resonator 100 includes a drive device 500, which is illustrated merely schematically in FIGS. 1 and 2. The drive device 500 is provided for coupling radio-frequency electromagnetic power into the cavity 200 of the RF resonator 100. The drive device 500 is for this purpose designed to apply a radio-frequency electrical AC voltage between the first enclosed coating 315 and the second enclosed coating 325 and thus also between the first inner coating 310 and the second inner coating 320. The guide device 500 preferably includes a solid-state power transistor or some other solid-state switch. Particularly preferably, the drive device 500 includes a plurality of solid-state power transistors arranged in a ring-shaped manner in the region of the ring 230 of the cavity 200 in a manner extending circumferentially on the outer side 250 of the lateral surface 280 of the cavity 200.

If the drive device 500 applies a radio-frequency electrical AC voltage between the first inner coating 310 and the second inner coating 320, then radio-frequency electric currents are excited in the first inner coating 310 and the second inner coating 320. If the frequency of the AC voltage applied by the drive device 500 between the first inner coating 310 and the second inner coating 320 corresponds to a resonant frequency of the RF resonator 100, then the current flow induced in the inner coatings 310, 320 brings about an excitation of a resonant radio-frequency oscillation mode in the interior 290 of the cavity 200. Consequently, the drive device 500 allows radio-frequency electromagnetic power to be coupled capacitively into the cavity 200 of the RF resonator 100, in order to excite and amplify a resonant radio-frequency oscillation in the interior of the cavity 200.

Advantageously, the cavity 200 of the RF resonator 100 simultaneously serves as vacuum vessel and as carrier for the electrically conductive inner coatings 310, 320, which form the actual resonator.

Although the invention has been more specifically illustrated and described in detail by the preferred exemplary embodiment, the invention is not restricted by the examples disclosed. Other variations may be derived therefrom by a person skilled in the art, without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An RF resonator comprising:
a cylindrical cavity composed of a dielectric material,
wherein the cavity comprises a first cylindrical portion, a second cylindrical portion and a dielectric ring connecting the first portion and the second portion,
wherein an inner side of the first cylindrical portion has an electrically conductive first inner coating and an inner side of the second cylindrical portion has an electrically conductive second inner coating,
wherein an electrically conductive first enclosed coating is arranged between the first cylindrical portion and the dielectric ring and an electrically conductive second enclosed coating is arranged between the second cylindrical portion and the dielectric ring,
wherein the first enclosed coating is conductively connected to the first inner coating and the second enclosed coating is conductively connected to the second inner coating, and
a voltage source provided for applying a radio-frequency electrical voltage between the first enclosed coating and the second enclosed coating.

2. The RF resonator as claimed in claim 1, wherein the first enclosed coating, the second enclosed coating, or both the first and second enclosed coatings are ring-shaped.

3. The RF resonator as claimed in claim 1, wherein the first enclosed coating, the second enclosed coating, or both the first and second enclosed coatings are a plurality of conductive contact pins.

4. The RF resonator as claimed in claim 1, wherein the dielectric ring is oriented perpendicularly to a longitudinal direction of the cavity.

5. The RF resonator as claimed in claim 1, wherein the dielectric ring is arranged in the center of the cavity in a longitudinal direction of the cavity.

6. The RF resonator as claimed in claim 1, wherein the voltage source comprises a solid-state power transistor.

7. The RF resonator as claimed in claim 6, wherein the voltage source comprises a plurality of solid-state power transistors arranged in the region of the dielectric ring in a manner extending circumferentially on the outside around the cavity.

8. The RF resonator as claimed in claim 1, wherein the dielectric material is a glass or a ceramic.

9. The RF resonator as claimed in claim 1, wherein the cavity has a circular-cylindrical shape.

10. The RF resonator as claimed in claim 1, wherein the cavity is designed to be evacuated to a reduced air pressure compared with the surroundings of the cavity.

11. A particle accelerator for accelerating electrically charged particles, the particle accelerator comprising:
an RF resonator comprising a cylindrical cavity composed of a dielectric material, wherein the cavity comprises a first cylindrical portion, a second cylindrical portion and a dielectric ring connecting the first portion and the second portion, wherein an inner side of the first cylindrical portion has an electrically conductive first inner coating and an inner side of the second cylindrical portion has an electrically conductive second inner coating, wherein an electrically conductive first enclosed coating is arranged between the first cylindrical portion and the dielectric ring and an electrically conductive second enclosed coating is arranged between the second cylindrical portion and the dielectric ring, wherein the first enclosed coating is conductively connected to the first inner coating and the second enclosed coating is conductively connected to the second inner coating, and a voltage source provided for applying a radio-frequency electrical voltage between the first enclosed coating and the second enclosed coating.

12. The particle accelerator as claimed in claim 11, wherein the first enclosed coating, the second enclosed coating, or both the first and second enclosed coatings are ring-shaped.

13. The particle accelerator as claimed in claim 11, wherein the first enclosed coating, the second enclosed coating, or both the first and second enclosed coatings are a plurality of conductive contact pins.

14. The particle accelerator as claimed in claim 11, wherein the dielectric ring is oriented perpendicularly to a longitudinal direction of the cavity.

15. The particle accelerator as claimed in claim 11, wherein the dielectric ring is arranged in the center of the cavity in a longitudinal direction of the cavity.

16. The particle accelerator as claimed in claim 11, wherein the voltage source comprises a solid-state power transistor.

17. The particle accelerator as claimed in claim 16, wherein the voltage source comprises a plurality of solid-state power transistors arranged in the region of the dielectric ring in a manner extending circumferentially on the outside around the cavity.

18. The particle accelerator as claimed in claim 11, wherein the dielectric material is a glass or a ceramic.

19. The particle accelerator as claimed in claim 11, wherein the cavity has a circular-cylindrical shape.

20. The particle accelerator as claimed in claim 11, wherein the cavity is designed to be evacuated to a reduced air pressure compared with the surroundings of the cavity.

* * * * *